(12) United States Patent
Jadhav et al.

(10) Patent No.: US 7,812,438 B2
(45) Date of Patent: Oct. 12, 2010

(54) VIA OFFSETTING TO REDUCE STRESS UNDER THE FIRST LEVEL INTERCONNECT (FLI) IN MICROELECTRONICS PACKAGING

(75) Inventors: Virendra R. Jadhav, Wappingers Falls, NY (US); David L. Questad, Hopewell Junction, NY (US); Kamal K. Sikka, Poughkeepsie, NY (US); Xiaojin Wei, Fishkill, NY (US); Jiantao Zheng, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 120 days.

(21) Appl. No.: 11/970,130

(22) Filed: Jan. 7, 2008

(65) Prior Publication Data

US 2009/0174084 A1    Jul. 9, 2009

(51) Int. Cl.
*H01L 23/04* (2006.01)
(52) U.S. Cl. ......................... 257/698; 257/773; 257/774
(58) Field of Classification Search ................. 257/698, 257/773, 774, 737, 786, 738, 778
See application file for complete search history.

(56) References Cited

U.S. PATENT DOCUMENTS

| 5,315,485 | A | * | 5/1994 | Magill et al. ................. 361/767 |
| 5,784,262 | A | | 7/1998 | Sherman |
| 6,833,615 | B2 | | 12/2004 | Geng et al. |
| 7,208,348 | B2 | | 4/2007 | Geng et al. |
| 2005/0128721 | A1 | * | 6/2005 | Tay et al. ...................... 361/777 |

* cited by examiner

*Primary Examiner*—Steven Loke
*Assistant Examiner*—Kimberly M Thomas
(74) *Attorney, Agent, or Firm*—Lisa U Jaklitsch; Katherine S. Brown

(57) ABSTRACT

The invention is directed to an improved microelectronics device that reduces BEOL delamination by reducing the tensile stress imposed on the via which connects first level interconnects with the BEOL. Tensile stress imposed on the via is reduced by shifting the via towards the center of a silicon chip or alternatively shifting the UBM towards the corners of the silicon chip.

11 Claims, 8 Drawing Sheets

VIA OFFSETTING TO REDUCE STRESS UNDER THE FIRST LEVEL INTERCONNECT (FLI) IN MICROELECTRONICS PACKAGING

BACKGROUND OF THE INVENTION

1. Field of the Invention

The invention relates generally to microelectronics devices, and more particularly, to microelectronics packaging.

2. Description of the Related Art

Flip chip microelectronic assembly is the direct electrical connection of face-down silicon dies onto chip carriers, by means of conductive bumps on chip bond pads. Flip chip microelectronic assembly will be described with reference to FIG. 1a, which depicts the prior art. Bumps 118, which are first level interconnects, could be solder based bumps, or pure copper, or any other form of conductive bumps 118 connect the integrated circuits (silicon die) 110 to a chip carrier 120. Bond pads 114, called under bump metallization (UBM), which consist of a few layers of metals, provide a pad metallurgy that protects the integrated circuit (IC) chip 110, while making a good mechanical and electrical connection to the solder bump 118. In current applications, the UBM 114 and bump 118 lie on top of a thick soft polymer layer 112 with a small via 116 connecting the bump 118 to the underlying finer metal wires (called back-end-of-line structure (BEOL)). In prior art microelectronic assemblies, the via 116, UBM 114, and solder bump 118 are co-centered.

One problem associated with prior art microelectronic assemblies, and more specifically a co-centered via 116, UBM 114, and bump 118 is that during chip 110/chip carrier 120 assembly, bumps 118 in the peripheral regions, e.g. corners, of the chip 110, cause delamination in the BEOL because the vias 116 in the peripheral regions of the chip 110 undergo more tensile stress than vias 116 located towards the center of the chip 110.

Chip 110/chip carrier 120 assembly rotates the bump 118 such that one side of bump 118 pulls away from the silicon chip 110, i.e. tensile stress, and other side of the bump pushes into the silicon chip 110, i.e. compressive stress. Bumps 118 located at the center of the chip 110 experience less rotation than bumps 118 located at the peripheral regions for the chip 110. Therefore, the bumps 118 located at the center of the chip 110 suffer less BEOL delamination than bumps 118 located in the peripheral regions of the chip 110.

FIG. 1b depicts the forces applied to the prior art microelectronics assembly 100 during chip attach for a bump 118 located in the peripheral regions of the silicon chip 110. Fx, Fy depict the net forces applied to the bump 118 during chip attach, and f(x) depicts the tensile or compressive forces applied along the UBM 114 and chip 110 interface. The force f(x) transitions from compressive to tensile stress along the UBM 114 and chip 110 interface. When the via 116, UBM 114, and bump 118 are co-centered, as shown in FIG. 1a, the via 116 is located at a position of tensile stress as shown in FIG. 1b.

A rigid connection between the bump 118 and the via 116 facilitates the force transfer from the chip carrier 120 to the region directly under the via 116. A thick soft polymer 112 provides a stress buffer to the BEOL region underneath the bump 118 edge, however the region under the via 116 does not have a stress buffer. Therefore, the via 116 experiences the full effect of the stress under the bump 118, which when the via 116 is centered with the bump 118, is tensile as depicted in FIG. 1b. Such tensile force causes delamination in the BEOL.

As microelectronics technology evolves, low k dielectric materials are more frequently utilized. Low k dielectric is even further prone to delamination in the BEOL. Therefore, a solution to delamination in the BEOL for bumps located in the peripheral regions of the microelectronics chip becomes ever more critical.

FIG. 1c depicts a top view of a chip 110 with the prior art microelectronics assembly 100. The chip includes multiple horizontal rows of UBM 114 with an included via 116. The geometric center of each via 116 is centered with the geometric center of the UBM 114, which is in turn aligned with the centerline of the horizontal row in which the UBM 114 and included via 116 lie.

What is needed in the art is an improved microelectronics chip package that reduces delamination in the BEOL associated with bumps located in the peripheral regions of a microelectronics chip.

BRIEF SUMMARY OF THE INVENTION

The invention is directed to a microelectronics device.

A first embodiment of the invention comprises a plurality of bond pads for connection with electrical contacts. Each bond pad has a geometric center and circular perimeter. Each bond pad includes a via with a geometric center within the bond pads circular perimeter. Each bond pad and associated via is aligned with one of a plurality of horizontal rows having a centerline on the microelectronics device. Within the same horizontal row of bond pads and associated vias, the geometric center of at least one bond pad is aligned with the centerline of the horizontal row, while the geometric center of at least one via is offset from the centerline of the horizontal row and the offset in a direction towards the geometric center of the microelectronics device.

A second embodiment of the invention comprises a plurality of bond pads for connection with electrical contacts. Each bond pad has a geometric center and circular perimeter. Each bond pad includes a via with a geometric center within the bond pads circular perimeter. Each bond pad and associated via is aligned with one of a plurality of horizontal rows having a centerline on the microelectronics device. Within the same horizontal row of bond pads and associated vias, the geometric center of each via is aligned with the centerline of the horizontal row, while the geometric center of at least one bond pad is offset from the centerline of the horizontal row and the offset in a direction away from the geometric center of the microelectronics device.

The invention solves the problem of delamination in the BEOL caused by microelectronics chip package assembly by reducing the tensile stress on the via which connects the bump to the back-end-of-line (BEOL). In doing so, the invention reduces delamination in the BEOL, which has traditionally been especially problematic for bumps located in the peripheral regions of the microelectronics chip.

For at least the foregoing reasons, the invention improves microelectronics technology.

BRIEF DESCRIPTION OF THE DRAWINGS

The features and the element characteristics of the invention are set forth with particularity in the appended claims. The figures are for illustrative purposes only and are not drawn to scale. Furthermore, like numbers represent like features in the drawings. The invention itself, however, both as to organization and method of operation, may best be understood by reference to the detailed description which follows, taken in conjunction with the accompanying figures, in which:

DETAILED DESCRIPTION OF THE INVENTION

The invention will now be described with reference to the accompanying figures. In the figures, various aspects of the structures have been depicted and schematically represented in a simplified manner to more clearly describe and illustrate the invention.

By way of overview and introduction, the invention is directed to a method for creating a microelectronics package that reduces delamination in back-end-of-the-line (BEOL) structures caused by tensile stress under the via that connects first level interconnects with the BEOL. The invention reduces the tensile stress placed under the via by either (1) shifting the via towards the center of a chip or (2) shifting the UBM towards the corners of the chip. In so doing, the invention reduces the tensile stress imposed under the via that connects first level interconnects.

Figure 2A:
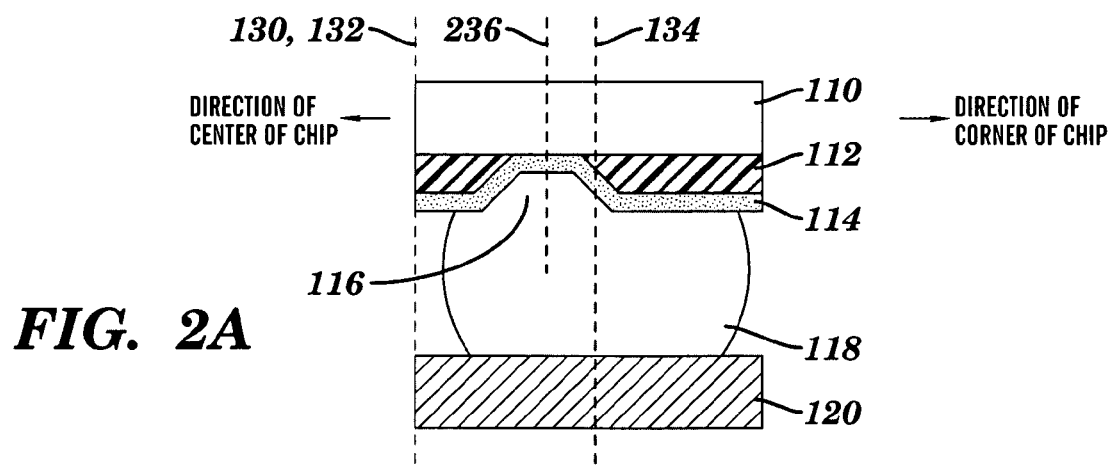
FIGS. 2a-2c depict a first embodiment of the invention, the tensile or compressive forces applied at the interface of the first level interconnect with the chip with a microelectronics package in accordance with a first embodiment of the invention, and a top view of the chip with a microelectronics package in accordance with a first embodiment of the invention.

A first embodiment of the invention will be described with reference to FIGS. 2a-2c. As shown in FIG. 2a, the via 116 is no longer co-centered with the UBM 114 and bump 118. Instead, the via center 236 is shifted towards the center of the chip 110. While the via center 236 is shifted towards the center of the chip 110, the UBM edge 132 in FIG. 2a remains unshifted, and therefore the UBM 114 remains centered with bump 118.

Figure 1A:
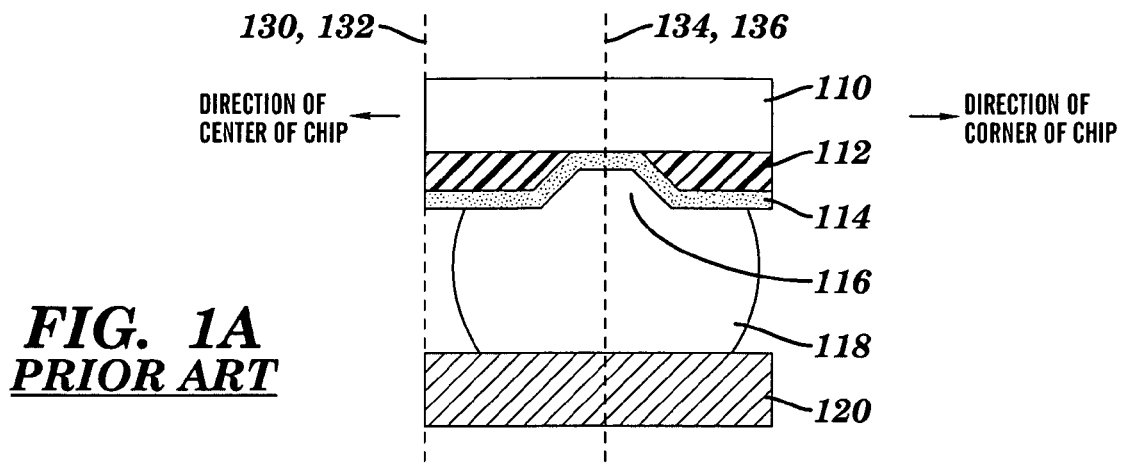
FIGS. 1a-1c depict a prior art microelectronics package, the tensile or compressive forces applied at the interface of the first level interconnect with the chip with a prior art microelectronics package, and a top view of the chip with a prior art microelectronics package.
Figure 2B:
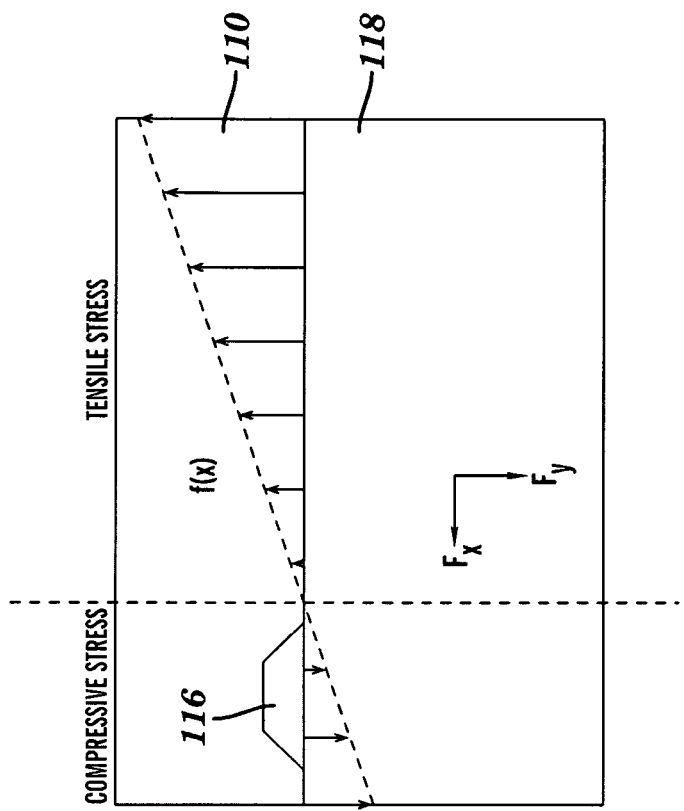
Figure 1B:
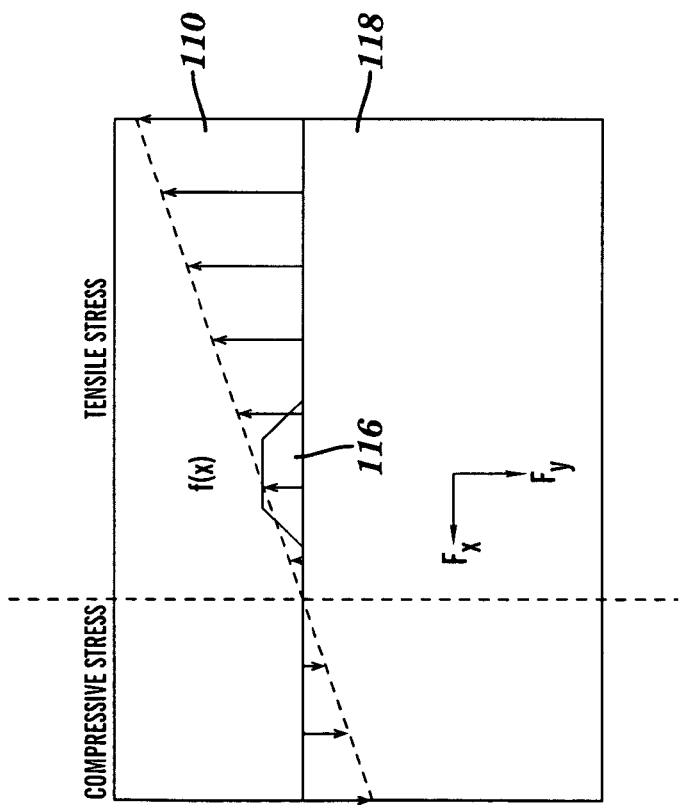

FIG. 2b depicts the resultant forces on the via 116, when the via center 236 is shifted in the direction of the center of the chip 110. Notice that while the forces applied to the bump 118 during chip attach Fx, Fy remain at the same location, and consequently the reaction force along the UBM 114 and die 110 interface remains the same, the via 116 has shifted from a location of tensile stress as shown in FIG. 1b to a location of compressive stress as shown in FIG. 2b.

Figure 1C:
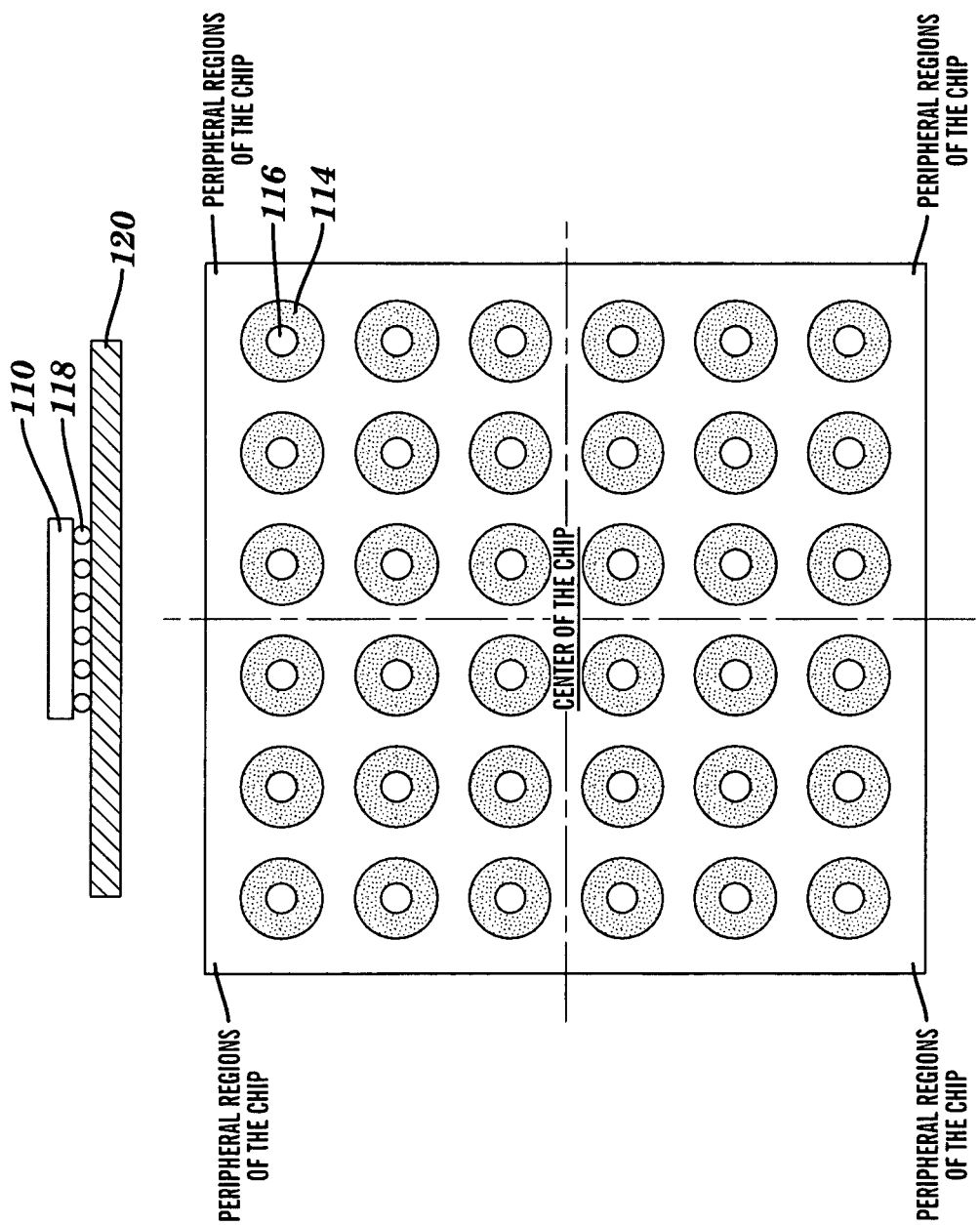
Figure 2C:
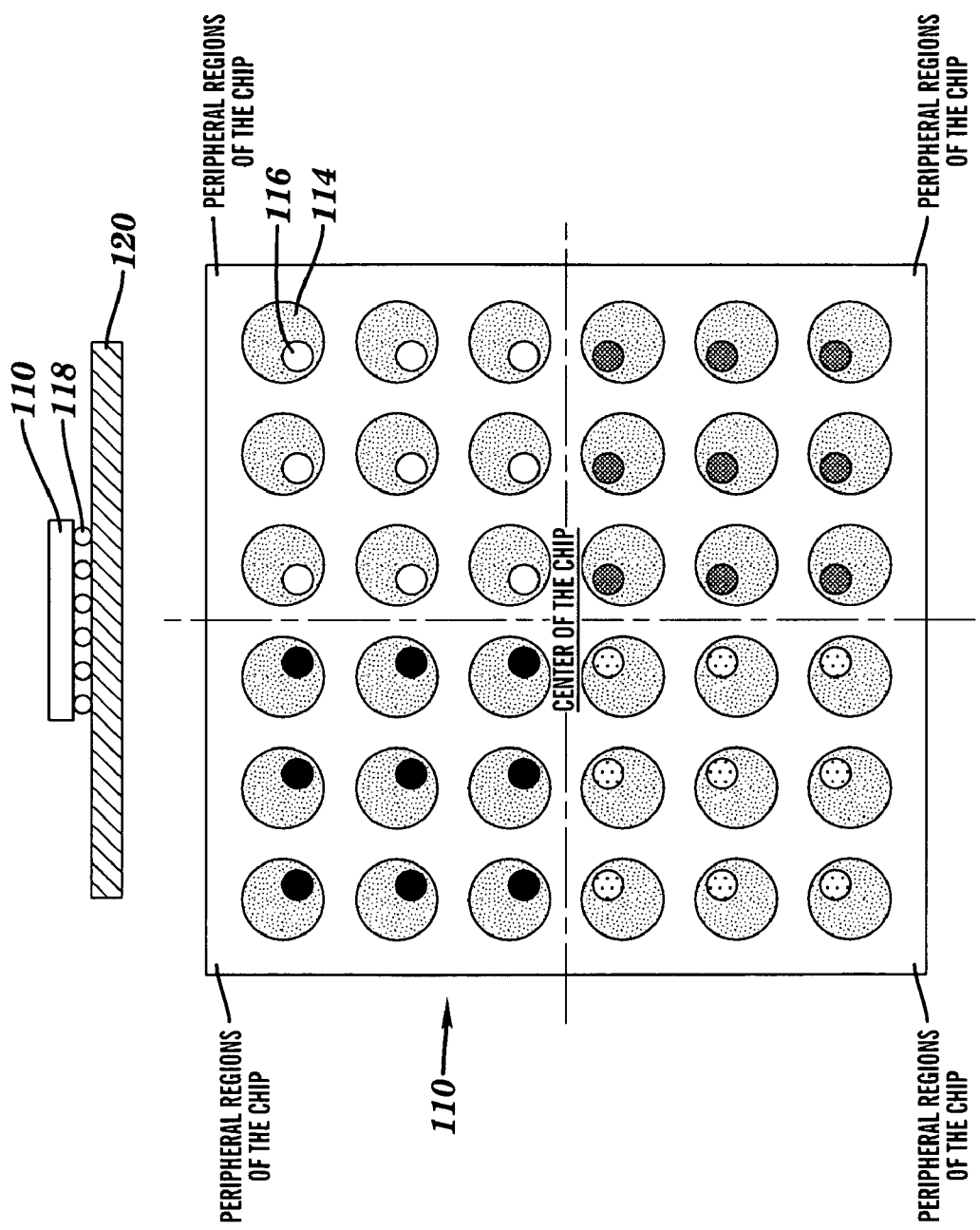

FIG. 2c depicts the top view of the chip 110 in accordance with a first embodiment of the present invention. Similar to microelectronics assembly in FIG. 1c, the UBM 114 and associated vias 116 are aligned in one of a plurality of rows. Unlike the microelectronics assembly in FIG. 1c, however, while the UBM 114 is aligned with a centerline of the horizontal row, the vias 116 associated with the UBM are offset. More specifically, the vias 116 are offset in a direction towards the geometric center of the microelectronics device. By shifting the vias 116 towards the geometric center of the chip, the vias 116 experience less tensile stress as shown in FIG. 2b, and therefore reduced delamination in the BEOL.

Figure 3A:
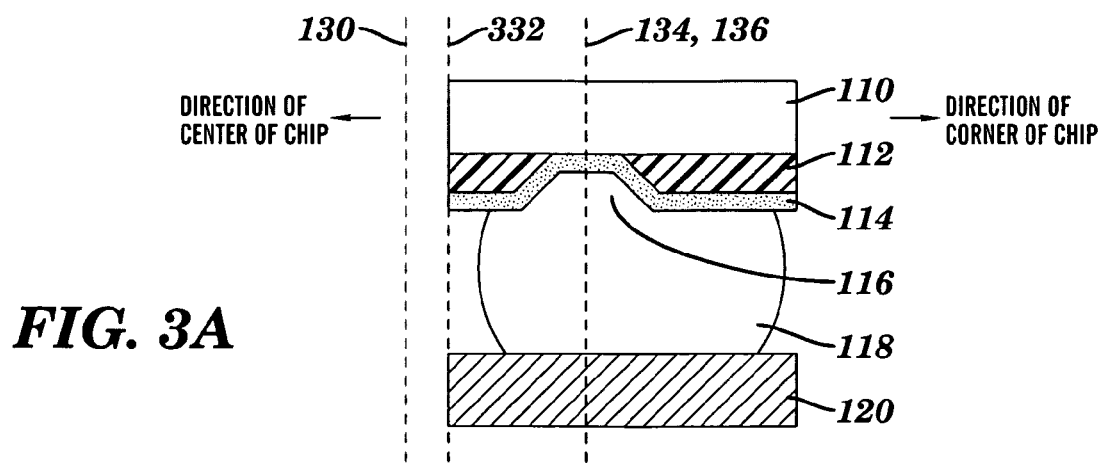
FIGS. 3a-3b depict a second embodiment of the invention, the forces applied at the interface of the first level interconnect with the chip with a microelectronics package in accordance with a second embodiment of the invention, and a top view of the chip with a microelectronics package in accordance with a second embodiment of the invention.

A second embodiment of the invention will be described with reference to FIGS. 3a-3c. While in FIGS. 1a and 2a the UBM 114 remains centered with bumps 118, in FIG. 3a the UBM 114 shifts towards the peripheral regions, i.e. corners of the chip. Therefore, while in FIGS. 1a and 2a the UBM edge 132 remains aligned with edge 130, in FIG. 3a the UBM edge 332 shifts towards the peripheral regions of the chip. Edge 130 is the UBM edge which a prior art centered via will lie in. In contrast to FIG. 2a, the via center 136 remains aligned with center 134, which is the center of an un-shifted via.

Figure 3B:
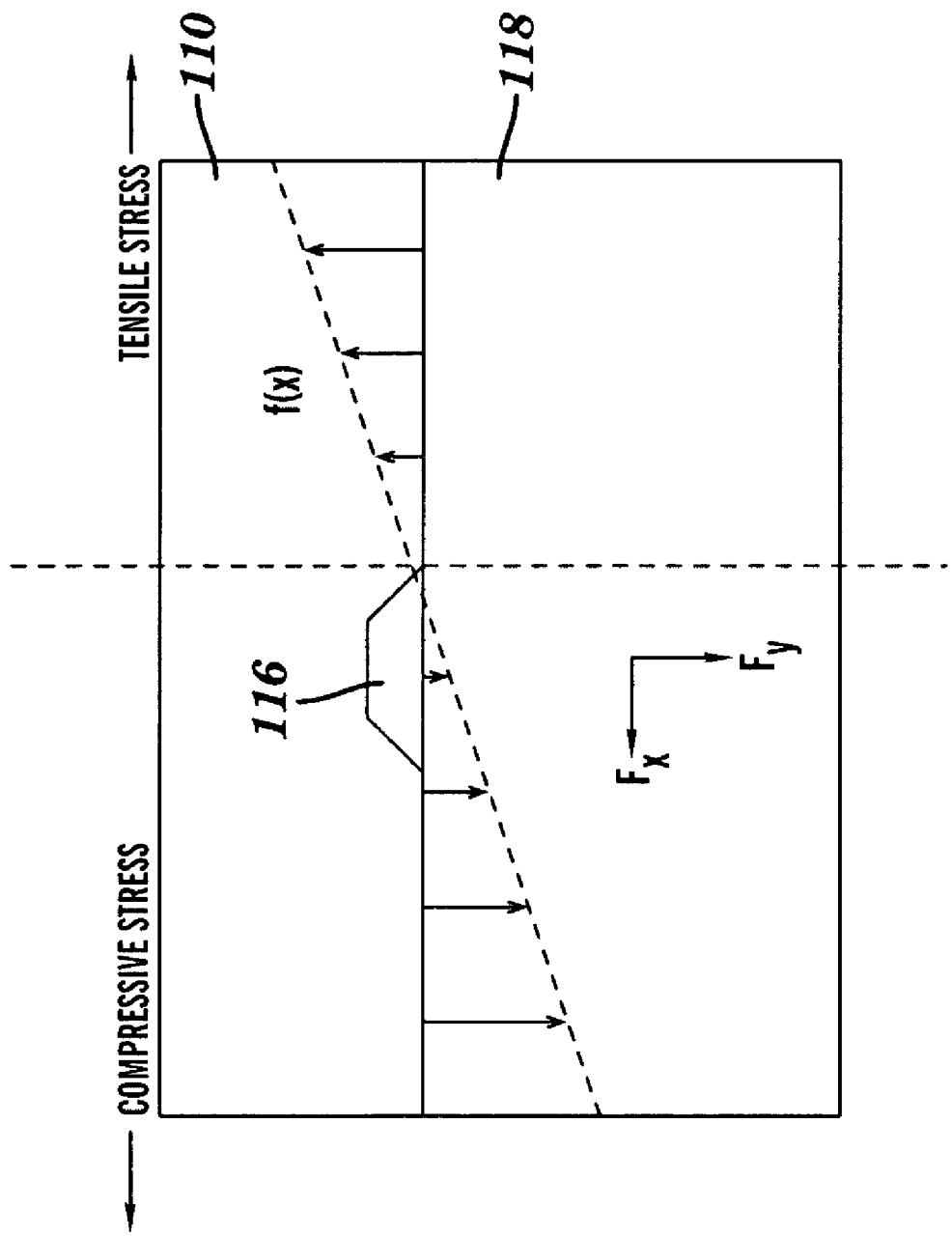

FIG. 3b depicts the resultant forces on the via 116 with a microelectronics package in accordance with a second embodiment of the invention. Similar to the first embodiment, the second embodiment reduces the tensile stress on the via 116. By shifting the UBM 114 towards the peripheral regions of the chip 110, the tensile stress on the via 116 is reduced, and as shown in FIG. 3b, the via 116 moves to a location of compressive stress.

Figure 3C:
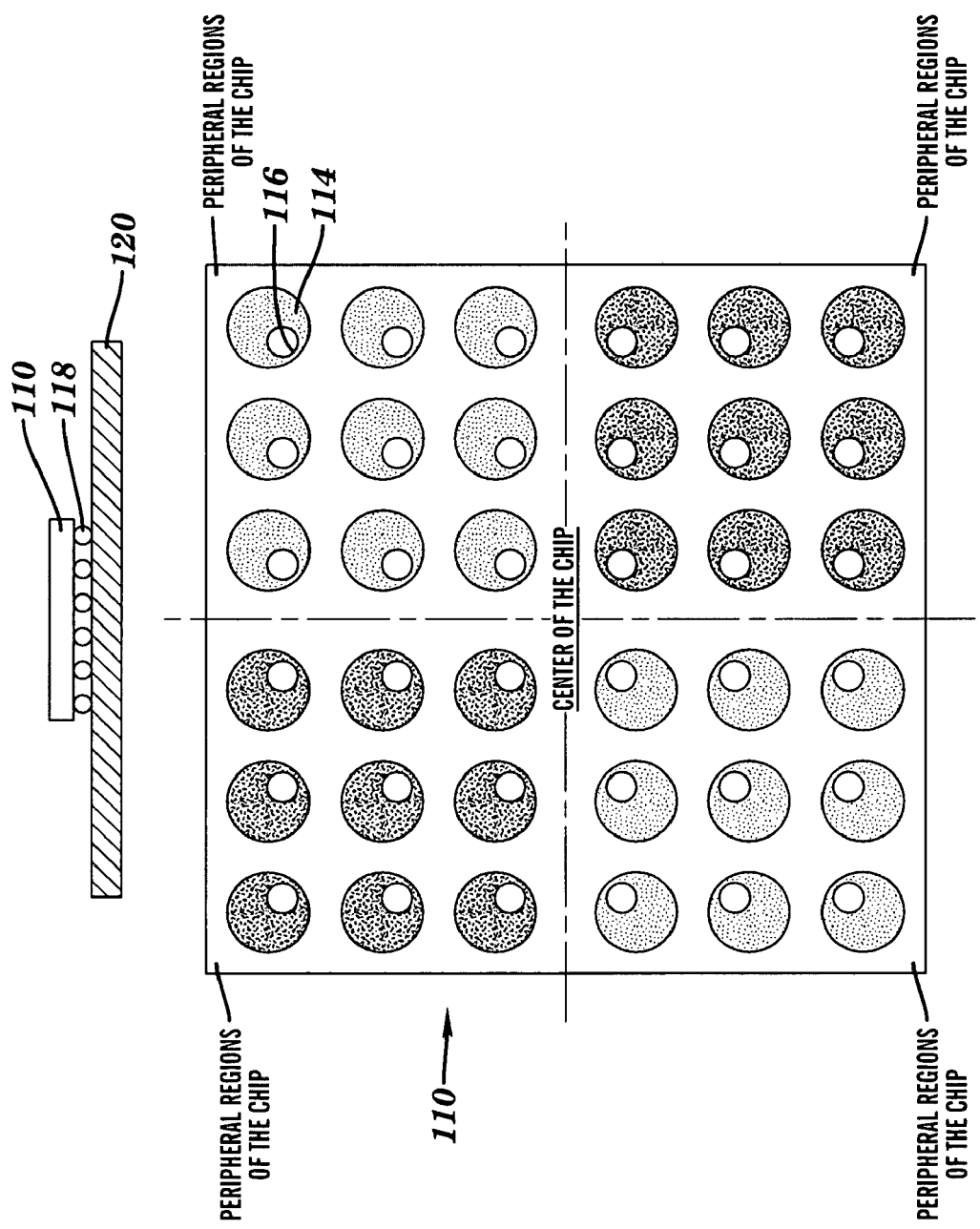

FIG. 3c depicts the top view of the chip 110 in accordance with a second embodiment of the invention. Similar to the microelectronics assembly depicted in FIGS. 1c, 2c, the UBM 114 and associated vias 116 are located in horizontal rows. Similar to the microelectronics assembly of FIG. 1c, the vias 116 of the microelectronics assembly in FIG. 3c are aligned with the centerline of the horizontal row in which the via 116 lies. Unlike the microelectronics assembly of FIG. 1c or FIG. 2c, the UBM 114 is offset from the centerline of the horizontal row, and more specifically the UBM 114 is offset in a direction away from the geometric center of the microelectronics device and towards the peripheral regions, i.e. corners, of the microelectronics device.

In addition to reducing delamination under the via 116, the embodiments of the invention offer implementation and cost flexibility. More specifically, chip manufacturers would implement the first embodiment of the invention, while chip carrier manufacturers would implement the second embodiment of the invention. In so doing, the embodiments of the invention enable implementation and associated costs to be shifted between the chip and chip carrier manufacturers, while still maintaining the benefit of reduced delamination under the via 116.

Figure 4:
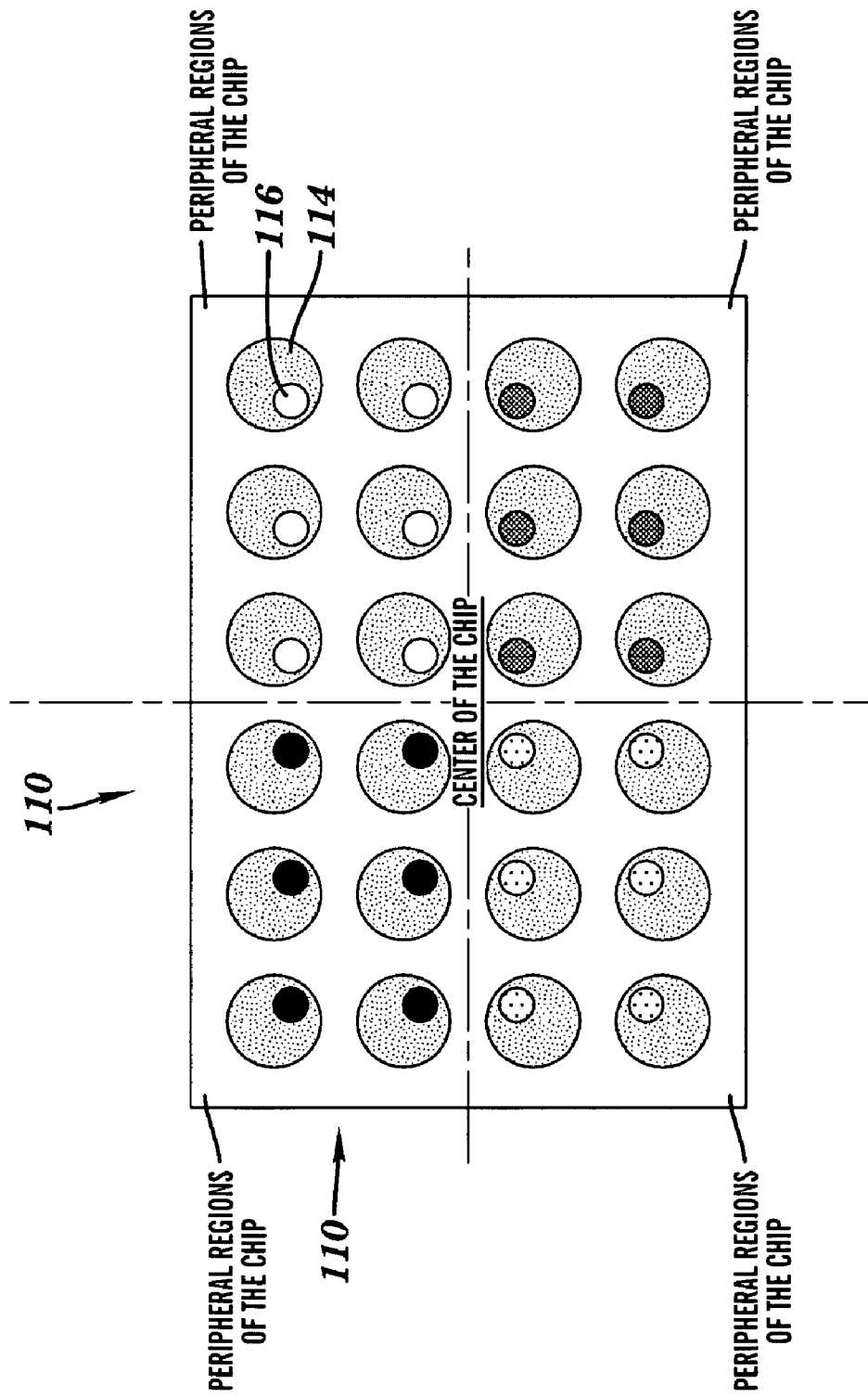
FIGS. 4-5 depict alternative embodiments of the invention.
Figure 5:
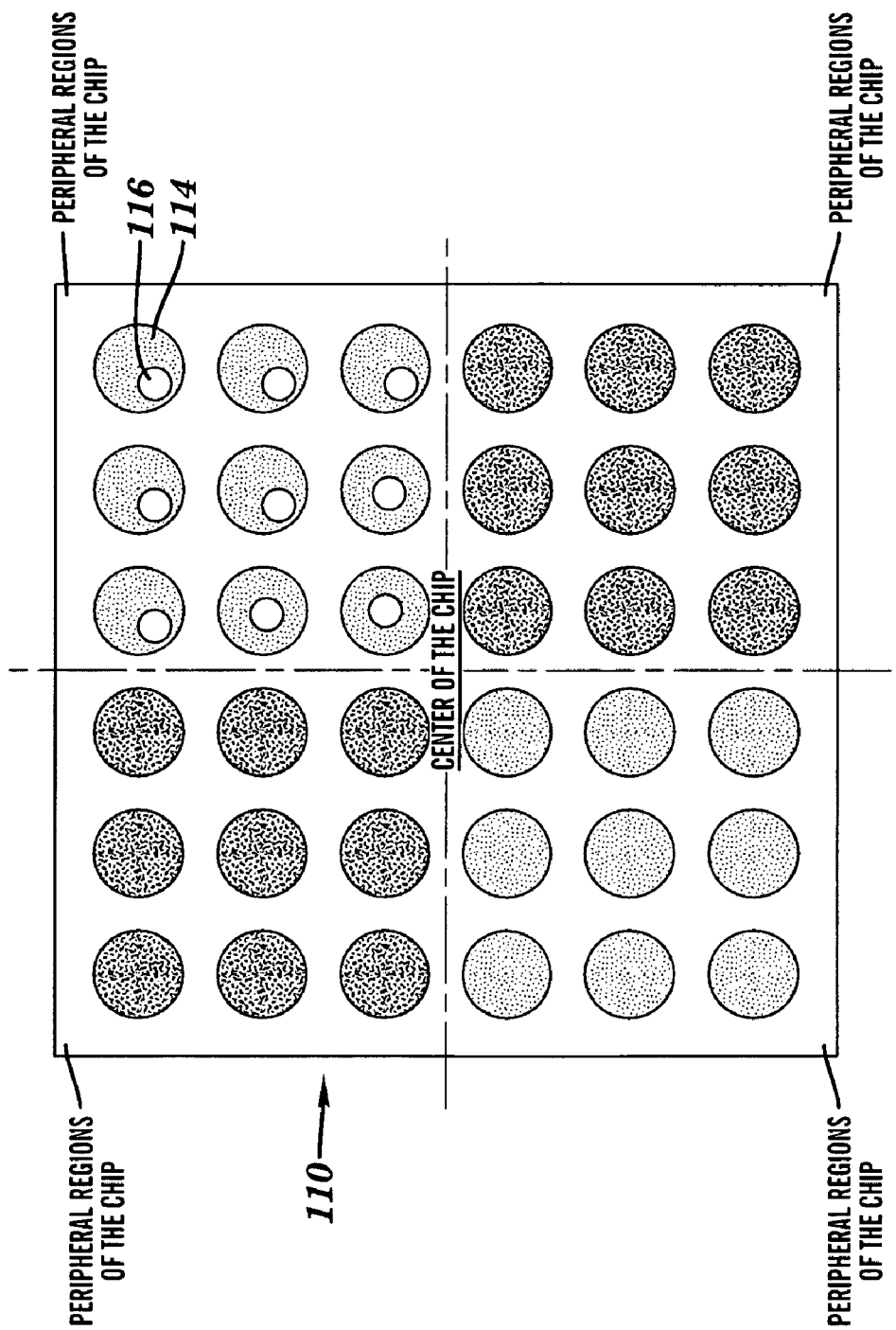

FIGS. 4-5 depict top views of the chip 110 for alternative embodiments of the invention. FIG. 4 depicts a rectangular chip 110 with the vias 116 shifted towards the center of the chip 110. As one skilled in the art would appreciate, the invention is not limited to via 116 or UBM 114 shifting for square shaped chips but could include various alternative shaped chips, including but not limited to rectangular shaped chips. FIG. 5 depicts a square shaped chip for which only the vias 116 in the peripheral regions of the chip shift towards the center of the chip. BEOL delamination worsens towards the peripheral regions of the chip 110. Therefore, as one skilled in the art would appreciate, compensation for the BEOL delamination is more critical at the edges of the chip 110 than at the center of the chip 110. As one skilled in the art would also appreciated, the invention is not limited to via 116 or UBM shifting 114 for each via 116/UBM 114 pair on a chip 110 but could include selective via 116 or UBM shifting for regions which suffer the worst BEOL delamination, such as the peripheral regions of the chip 110.

While the invention has been particularly described in conjunction with a specific preferred embodiment and other alternative embodiments, it is evident that numerous alternatives, modifications and variations will be apparent to those skilled in the art in light of the foregoing description. It is therefore intended that the appended claims embrace all such alternatives, modifications and variations as falling within the true scope and spirit of the invention.

What is claimed is:

1. A silicon die comprising:
   a back-end-of-line (BEOL) layer covered by a stress buffer layer and a plurality of vias formed in the stress buffer layer, said vias extending through said stress buffer layer to said BEOL layer, and
   a plurality of bond pads for connection with electrical contacts, wherein each bond pad has a geometric center and a perimeter, said bond pads are formed over said vias in one to one correspondence such that a geometric center of each said via is within said perimeter of such corresponding bond pad, and each bond pad is aligned with one of a plurality of horizontal rows, each horizontal row having a centerline on said silicon die, and
   wherein within a first said horizontal row having a first centerline, said geometric center of at least one bond pad in said first horizontal row is aligned with said first centerline, while said via corresponding with said at least one bond pad is offset from said centerline and said offset is in a direction towards a geometric center of said silicon die.

2. A device as in claim 1, further comprising, wherein said bond pads comprise a substantially circular shape.

3. A device as in claim 1, further comprising, wherein said via corresponding with said at least one bond pad is located geometrically further away from said geometric center of said silicon die than at least one other via on said silicon die.

4. A device as in claim 1, further comprising, said silicon die having one of a square and rectangular shape.

5. A device as in claim 1, further comprising, wherein each via within said first horizontal row is offset from said first centerline and said offset is in a direction towards said geometric center of said silicon die.

6. A device as in claim 1, further comprising, wherein a subsection of said vias are offset from said centerlines of said plurality of horizontal rows, and said offset is in a direction towards said geometric center of said silicon die, said subsection of said vias located geometrically further away from said geometric center of said silicon die than other said vias.

7. A device as in claim 1 wherein said geometric center of each bond pad in said first horizontal row is aligned with said first centerline.

8. A device as in claim 1 wherein said geometric center of each bond pad is aligned with said centerline of said one of a plurality of horizontal rows.

9. A device as in claim 1, wherein said BEOL layer includes low-k dielectric material.

10. A device as in claim 1, wherein said stress buffer layer is a soft polymer material.

11. A device as in claim 1 further comprising, a chip carrier electrically connected through said bond pads to said silicon die.

* * * * *